United States Patent
Sills (10) Patent No.: US 8,937,290 B2
(45) Date of Patent: Jan. 20, 2015

(54) MEMORY CELLS

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/950,093

(22) Filed: Jul. 24, 2013

(65) Prior Publication Data

US 2013/0306930 A1 Nov. 21, 2013

Related U.S. Application Data

(62) Division of application No. 13/208,216, filed on Aug. 11, 2011, now Pat. No. 8,519,373.

(51) Int. Cl.
*H01L 29/04* (2006.01)
*H01L 45/00* (2006.01)

(52) U.S. Cl.
CPC .......... *H01L 45/1253* (2013.01); *H01L 45/085* (2013.01); *H01L 45/1233* (2013.01); *H01L 45/1246* (2013.01); *H01L 45/1266* (2013.01); *H01L 45/143* (2013.01); *H01L 45/146* (2013.01)
USPC .... 257/3; 257/4; 257/E47.007; 257/E45.002; 365/148

(58) Field of Classification Search
USPC ............ 257/3, 4, E47.007, E45.002; 365/148
See application file for complete search history.

(56) References Cited

U.S. PATENT DOCUMENTS

| | | | |
|---|---|---|---|
| 7,715,258 B2 | 5/2010 | Symanczyk et al. | |
| 7,737,428 B2 | 6/2010 | Symanczyk et al. | |
| 7,772,614 B2 | 8/2010 | Pinnow | |
| 2006/0022347 A1* | 2/2006 | Campbell | 257/762 |
| 2006/0060832 A1 | 3/2006 | Symanczyk et al. | |
| 2006/0181920 A1* | 8/2006 | Ufert | 365/153 |
| 2010/0108975 A1 | 5/2010 | Sun et al. | |
| 2010/0163829 A1 | 7/2010 | Wang et al. | |

(Continued)

FOREIGN PATENT DOCUMENTS

WO PCT/US2012/046913 1/2013
WO PCT/US2012/046913 2/2014

OTHER PUBLICATIONS

Beck et al., "A New Family of Mesoporous Molecular Sleves Prepared with Liquid Crystal Templates", J. Am. Chem. Soc., 1992(114), pp. 10834-10843.

(Continued)

*Primary Examiner* — Tan N Tran
(74) *Attorney, Agent, or Firm* — Wells St. John P.S.

(57) ABSTRACT

Some embodiments include memory cells. A memory cell may contain a switching region and an ion source region between a pair of electrodes. The switching region may be configured to reversibly retain a conductive bridge, with the memory cell being in a low resistive state when the conductive bridge is retained within the switching region and being in a high resistive state when the conductive bridge is not within the switching region. The memory cell may contain an ordered framework extending across the switching region to orient the conductive bridge within the switching region, with the framework remaining within the switching region in both the high resistive and low resistive states of the memory cell.

7 Claims, 6 Drawing Sheets

(56) References Cited

U.S. PATENT DOCUMENTS

2010/0193762 A1 8/2010 Hsieh et al.
2010/0243983 A1 9/2010 Chiang et al.

OTHER PUBLICATIONS

Holland et al., "Synthesis of Macroporous Minerals with Highly Ordered Three-Dimensional Arrays of Spheroidal Voids", Science Magazine, vol. 281, Jul. 24, 1998, pp. 538-540.
Imhof et al., "Ordered macorporous materials by emulsion templating", Letters to Nature, vol. 389, Oct. 30, 1997, pp. 948-951.
Kanatzidis, "Beyond Silica: Nonoxidic Mesostructured Materials", Advanced Materials, vol. 19, 2007, pp. 1165-1181.
Kresge et al., "Ordered mesoporous molecular sieves synthesized by a liquid-crystal template mechanism", Letters to Nature, vol. 359, Oct. 22, 1992, pp. 710-712.
MacLachlan et al., "Mesostructured Metal Germanium Sulfides", J. Am. Chem. Soc. 1999(121), pp. 12005-12017.
MacLachlan et al., "Non-aqueous supramolecular assembly of mesostructured metal germanium sulphides from (Ge4S10)4-clusters", Letters to Nature, Macmillan Magazines Lts., vol. 397, Feb. 25, 1999, pp. 681-684.
Ramanathan (Ed.), Thin Metal-Oxides Fundamentals and Applications in Electronics and Energy, 1st Ed., 2010, XVI, 337 p. 200 illus.
Scott et al., "Sunthesis of metal sulfide materials with controlled architecture", Current Opinion in Solid State and Materials Science, 1999(4), pp. 113-121.
Soten et al., "New Directions in self-assembly: materials synthesis over 'all' length scales", Current Opinion in Colloid & Interface Science, 1999(4), pp. 327-337.
Templin et al., "Organically Modified Aluminosilicate Mesostructures from Block Copolymer Phases", Science Magazine, vol. 278, Dec. 5, 1997, pp. 1795-1798.
Trikalitis et al., "Supramolecular Assembly of Hexagonal Mesostructured Germanium Sulfide and Selenide Nanocomposites Incorporating the Biologically Relevant Fe4S4 Cluster", Communications, Angew. Chem. Int. Ed., 2000, 39(24), pp. 4558-4562.

* cited by examiner

MEMORY CELLS

RELATED PATENT DATA

This patent resulted from a divisional of U.S. patent application Ser. No. 13/208,216, which was filed Aug. 11, 2011, and which is hereby incorporated herein by reference.

TECHNICAL FIELD

Memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory device is a programmable metallization cell (PMC). Such may be alternatively referred to as a conductive bridging RAM (CBRAM), nanobridge memory, or electrolyte memory. A PMC may use ion conductive material (for instance, a suitable chalcogenide or any of various suitable oxides) sandwiched between a pair of current conductive electrodes, and such material may be referred to as "switching" material. A suitable voltage applied across the electrodes can generate current-conductive super-ionic clusters or conducting filaments. Such may result from ion transport through the ion conductive material which grows the clusters/filaments from one of the electrodes (the cathode) and through the ion conductive material. The clusters or filaments create current-conductive paths between the electrodes. An opposite voltage applied across the electrodes essentially reverses the process and thus removes the conductive paths. A PMC thus comprises a high resistance state (corresponding to the state lacking a conductive bridge extending through a switching material) and a low resistance state (corresponding to the state having a conductive bridge extending through a switching material), with such states being reversibly interchangeable with one another.

Although there has been some effort toward development of PMC devices, there remains a need for improved memory cells. Accordingly, it would be desirable to develop new memory cells.

BRIEF DESCRIPTION OF THE DRAWINGS

FIGS. 2 and 3 diagrammatically illustrate an example embodiment PMC.

FIGS. 4 and 5 diagrammatically illustrate another example embodiment PMC.

FIGS. 8-10 diagrammatically illustrate another example embodiment PMC.

DETAILED DESCRIPTION OF THE ILLUSTRATED EMBODIMENTS

PMC devices (for instance, CBRAM devices) may utilize interstitial diffusion/drift of metal cations (for instance, $Ag^+$, $Cu^+$, etc.) along with electrochemical redox to reversibly form conductive filaments, and to thereby reversibly switch the devices between a high resistance state and a low resistance state. The conductive filaments may form within an electrolyte. In conventional PMC devices, an amorphous glass may serve as a solid electrolyte. The amorphous glass may comprise, for example, an oxide or chalcogenide.

The region of the PMC that supports the conductive filaments switches from low resistance in the presence of the conductive filament to high resistance in the absence of the conductive filament, and may be referred to as a "switching region."

A difficulty encountered with conventional PMC devices is that there may be non-uniformity of programming characteristics across an array of the devices. Such non-uniformity may result, at least in part, from randomness in the formation of conductive filaments within individual PMC devices. Specifically, each conductive filament results from dendritic growth of conductive material across the switching region, analogous to Brownian motion diffusion through the amorphous electrolyte network within the switching region. The random variability associated with such stochastic process leads to cell-to-cell non-uniformity in programming behavior, which problematically limits performance of memory arrays utilizing PMC devices.

In some embodiments, the invention includes incorporation of an ordered framework within a switching region of a PMC device, with such framework being configured to confine conductive filaments as they are formed across the switching region, and to thereby reduce the problematic variability associated with dendritic growth in conventional PMC devices.

Figure 1:
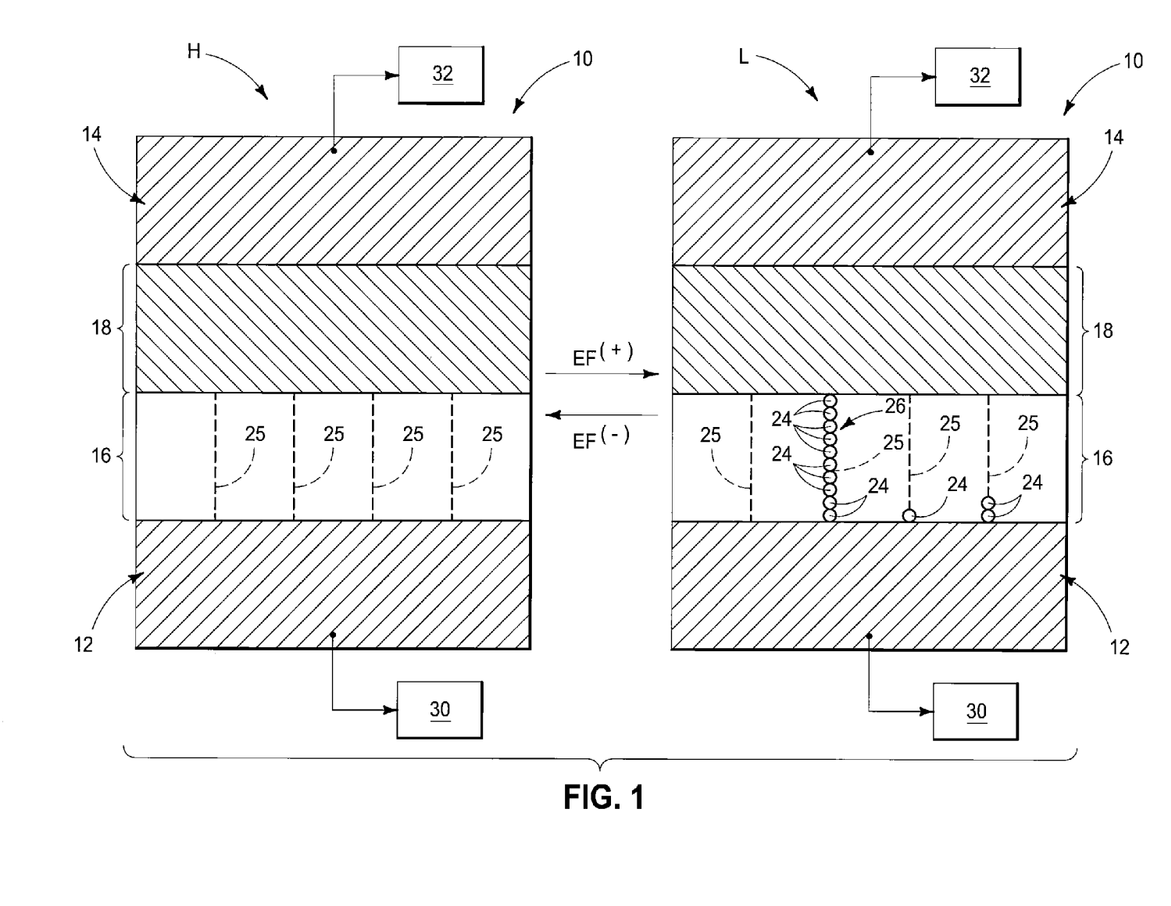
FIG. 1 diagrammatically illustrates an example embodiment PMC reversibly transitioning between a low resistance state and a high resistance state through application of appropriate electrical fields across the memory cell.

FIG. 1 shows a PMC device 10 in a high resistance state (H) and a low resistance state (L). The two resistance states are reversibly interchanged with one another through application of electric fields $EF^+$ and $EF^-$, with $EF^+$ being of opposite polarity relative to $EF^-$.

The PMC device comprises a pair of electrodes 12 and 14; and comprises a switching region 16 and an ion source region 18 between the electrodes.

Electrodes 12 and 14 may comprise any suitable electrically conductive composition or combination of compositions; and may be the same composition as one another or may be different compositions relative to one another.

The memory cell 10 is shown to have the bottom electrode 12 connected to external circuitry 30, and to have the top electrode 14 connected to external circuitry 32. Circuitries 30 and 32 may correspond to sense and/or access lines coupled to the electrodes, and configured for providing the appropriate electric fields across the memory cell during read/write operations. In some embodiments, the illustrated memory cell may be one of a plurality of memory cells of a memory array, and the circuitries 30 and 32 may be utilized to uniquely address each of the memory cells. In some embodiments, a "select device" (not shown) may be provided adjacent the memory cell to reduce undesired current leakage to and/or from the memory cell during utilization of the memory cell in a memory array. Example select devices include diodes, transistors, ovonic threshold switches, etc.

The ion source region 18 contributes ions which ultimately form conductive bridges across the switching region 16. The ion source region may comprise any suitable composition or combination of compositions; and in some embodiments will comprise one or both of copper and silver, and thus be configured for contributing copper cations and/or silver cations for formation of a conductive bridge. For instance, the ion source region may comprise a combination of copper and tellurium. The ion source region is shown to be electrically conductive, and specifically is shown with hatching analogous to the hatching utilized for illustrating the electrically conductive electrodes 12 and 14.

The switching region 16 may be a solid, gel, or any other suitable phase, and may comprise chalcogenide-type materials (for instance, materials comprising germanium in combination with one or more of antimony, tellurium, sulfur and selenium), oxides (for instance, zirconium oxide, hafnium oxide, tungsten oxide, silicon oxide, etc.) and/or any other suitable materials.

The switching region is shown to comprise pathways 25 (diagrammatically illustrated with dashed-lines) that extend across the switching region, and specifically that extend from electrode 12 to ion source region 18. The pathways may be considered to be part of an ordered framework within the switching region which is configured to orient a conductive bridge as the bridge forms across the switching region. The pathways are present in both the high resistance state (H) and the low resistance state (L) of the memory cell 10, but in the low resistance state a plurality of particles 24 (for instance, atoms or atomic clusters) extend along one of the pathways to form a conductive bridge 26 extending across the switching region 16. The individual particles may be charged or neutral along the conductive bridge. For instance, in some embodiments the individual particles may be ionic clusters and/or may be individual ions; and in some embodiments the individual particles may be electrochemically-plated metal. Although the conductive bridge is shown to comprise a plurality of particles, in some embodiments the particles may merge so that the conductive bridge is a single continuous filament. The conductive material within the conductive bridge may be any suitable composition or combination of compositions, and in some embodiments may comprise, consist essentially of, or consist of one or both of copper and silver.

The conductive bridge 26 is shown formed along one of the pathways 25, and conductive particles 24 are shown to deposit along a couple of the other pathways to create partial bridges. In some embodiments, conductive bridges may start along numerous pathways, but once a bridge is completed along one of the pathways current will pass along such bridge and the growth of bridges along the other pathways in the memory cell will cease.

Although multiple conductive pathways are shown extending through the switching region of the illustrated cell 10, in other embodiments (not shown) there may be only a single pathway provided across such switching region.

In the shown embodiment, the application of electric field $EF^+$ (specifically a field oriented from the shown top electrode to the shown bottom electrode) causes growth of the conductive bridge 26, and thus transitions the memory cell from the high resistance state (H) to the low resistance state (L); and the application of electric field $EF^-$ dissipates the conductive bridge 26, and thus transitions the memory cell from the low resistance state (L) to the high resistance state (H). The ordered framework remains within the switching region 16 in both the high resistance and the low resistive states of the memory cell, and accordingly the pathways 25 are shown to extend across the switching region in both states of the memory cell. The pathways 25 confine conductive bridges 26 to specific locations within a switching region, and thus provide for more ordered growth of the conductive bridges than occurs in conventional PMC devices. Such ordered growth may improve device-to-device uniformity during programming across a memory array. Thus, PMC devices having the pathways 25 may be utilized to develop memory arrays having improved performance relative to memory arrays comprising conventional PMC devices.

The ordered framework within the switching region may comprise any suitable composition or combination of compositions; and in some embodiments may comprise, consist essentially of, or consist of one or more of GeS, GeSe, SiO, ZrO, TiO, TaO, HfO, AlO, WO, SnO, NbO, ZrTiO, ZrWO, AlTiO, VO, MoO, NiO, YO, ReO, MnO, FeO, SiAlO, SiTiO; where the listed compositions are described in terms of principle components, rather than in terms of specific stoichiometries (for instance, AlO may correspond to $Al_2O_3$).

In some embodiments, it may be desired to chemically modify the material of the switching region to enhance formation and/or orientation of the pathways. Such modification may be accomplished utilizing, for example, one or more of ion exchange with cationic surfactant, thermal diffusion, photo-diffusion, etc.

Figure 8:
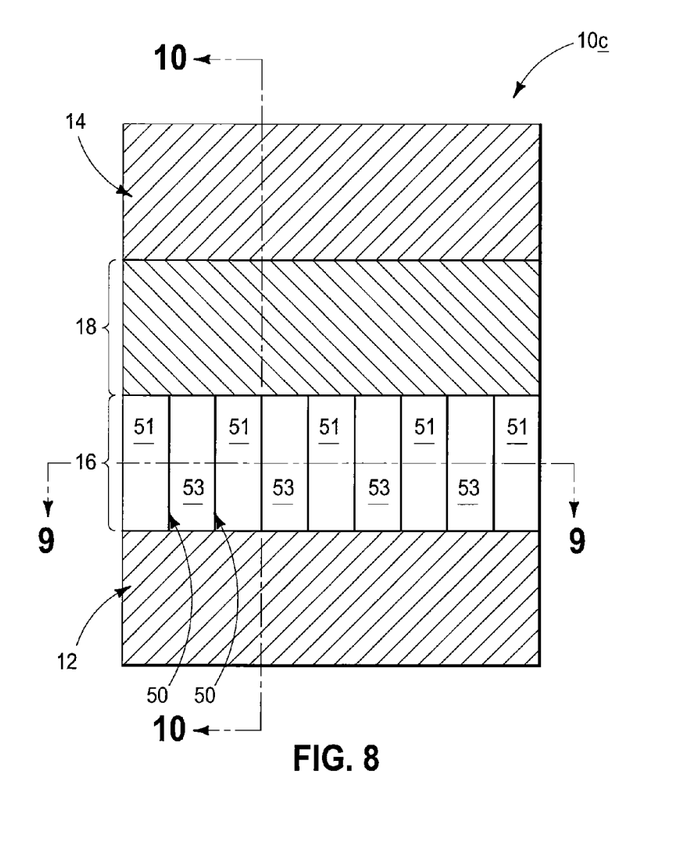
FIG. 8 is a cross-sectional side view of the PMC.
Figure 9:
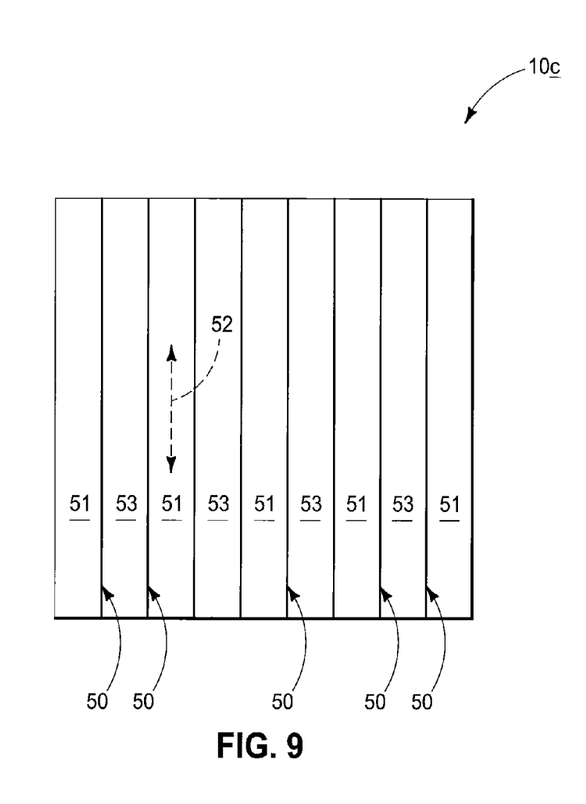
FIG. 9 is a view along the line 9-9 of FIG. 8.
Figure 10:
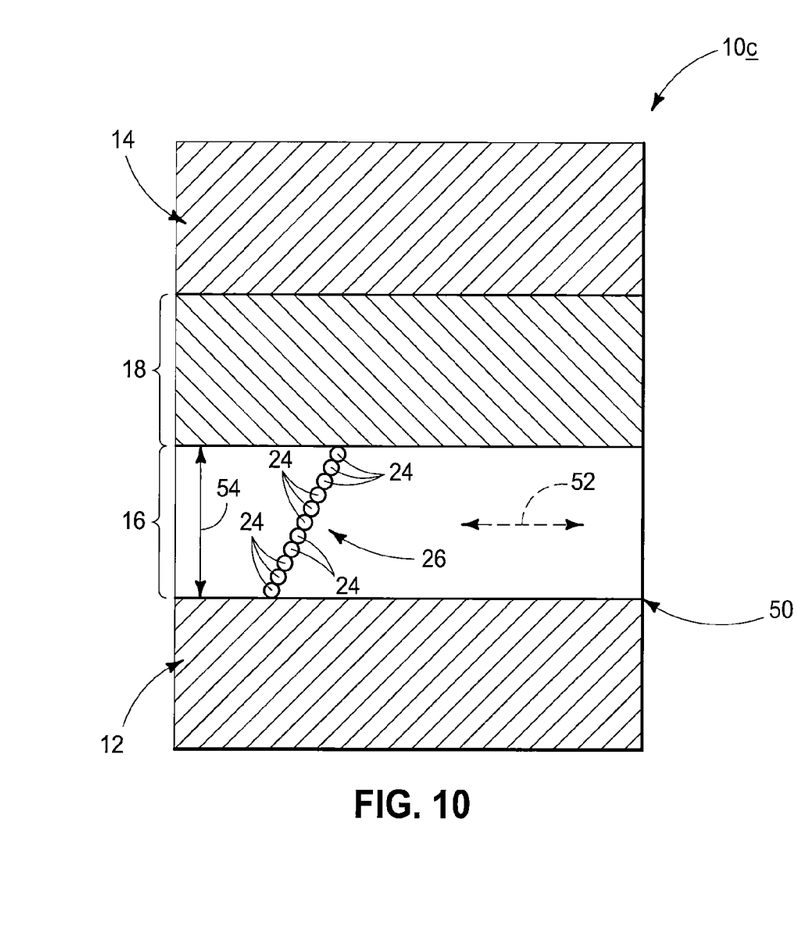
FIG. 10 is a view along the line 10-10 of FIG. 8. An example conductive bridge is shown in FIG. 10, but not shown in either of FIGS. 8 and 9.

In some embodiments, the pathways 25 may correspond to tubular structures (for instance, cylindrical micelles) extending through the switching region, or may correspond to interfaces along lamellar sheets. FIGS. 2-7 illustrate example embodiments in which the pathways correspond to tubular structures, and FIGS. 8-10 illustrate example embodiments in which the pathways correspond to interfaces along lamellar sheets.

Figure 2:
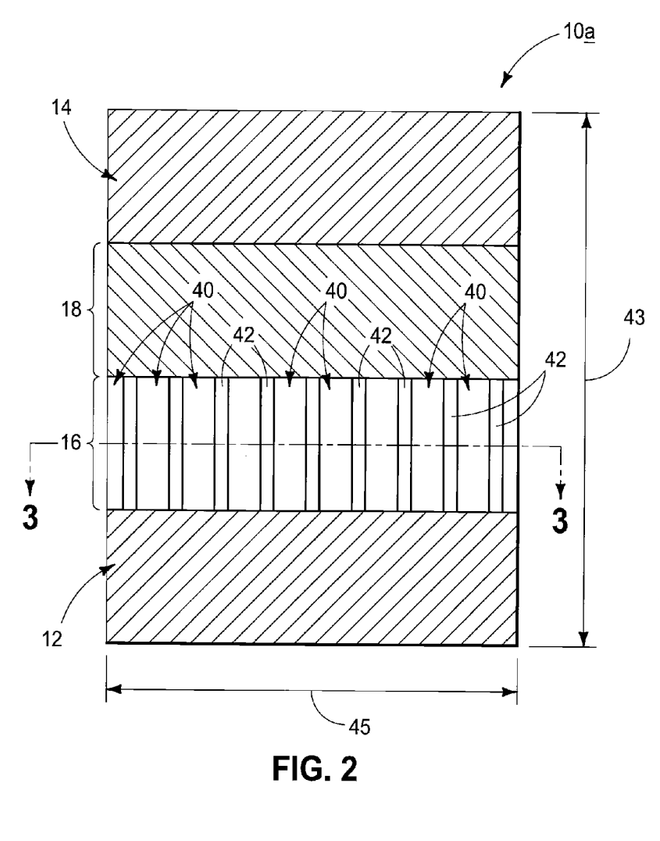
FIG. 2 is a cross-sectional side view of the PMC.
Figure 3:
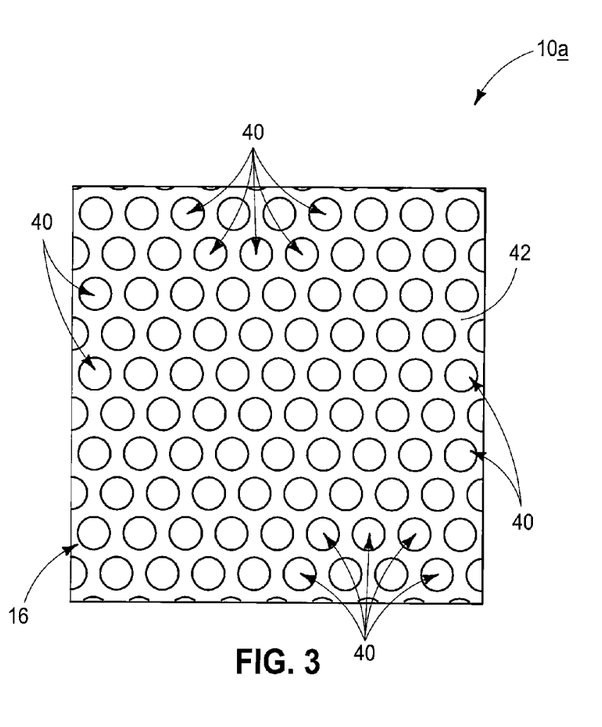
FIG. 3 is a view along the line 3-3 of FIG. 2.

Referring to FIGS. 2 and 3, an example embodiment memory cell 10a comprises the electrodes 12 and 14 discussed above, and comprises the switching region 16 and ion source region 18. The illustrated switching region comprises tubular structures 40 (only some of which are labeled) extending through a matrix 42. The tubular structures define the pathways 25 discussed above with reference to FIG. 1.

The tubular structures may be formed within the matrix utilizing any suitable processing, including, for example, emulsion templating, block copolymer technologies which form surface-normal cylinders, and/or methodologies which form tubular mesostructures. Example methodologies are described in MacLachlan et al. "Non-Aqueous Supramolecular Assembly of Mesostructured Metal Germanium Sulphides from $[Ge_4SIO]^{4-}$ Clusters" Nature 397 (1999) 681-4; Scott et al. "Synthesis of Metal Sulfide Materials with Controlled Architecture" Current Opinion Sol State & Mat Sci 4 (1999) 113-121; MacLachlan et al. "Mesostructured Metal Germanium Sulfides." J. Am. Chem. Soc. 121 (1999) 12005-12017; Templin et al. "Organically Modified Aluminosilicate Mesostructures from Block Copolymer Phases" Science 278 (1997) 1795-8; Imhof et al. "Ordered Macroporous Materials by Emulsion Templating" Nature 389 (1997) 48-51; Holland et al. "Synthesis of Macroporous Minerals with Highly Ordered Three-Dimensional Arrays of Spheroidal Voids" Science 281 (1998) 538-40; Kresge et al. "Ordered Mesoporous Molecular Sieves Synthesized by a Liquid-Crystal Template Mechanism" Nature 359 (1992) 710; Beck et al. "A New Family of Mesoporous Molecular Sieves Prepared with Liquid Crystal Templates" J Am. Chem. Soc. 114 (1992), 10834; and Trikalitis et al. "Supramolecular Assembly of Hexagonal Mesostructured Germanium Sulfide and Selenide Nanocomposites Incorporating the Biologically Relevant $Fe_4S_4$ Cluster." Angew. Chem. Int. Ed. 39 (2000) 4558-62.

The tubes 40 may be considered to be a confinement system; with individual tubes being configured to confine material of a conductive bridge. Specifically, the tubes may be configured to have internal diameters suitable for retaining and confining the material of a conductive bridge (for instance, the particles 24 of FIG. 1). In some embodiments, the tubes may have internal cross-sectional width dimensions of less than or equal to about 30 Å; and in particular embodiments may have internal cross-sectional width dimensions of from about 10 Å to about 20 Å. Such tubes may be particularly suitable for retaining copper-containing particles and/or silver-containing particles having thicknesses of less than or equal to about 20 atoms; such as, for example, particles having thicknesses of at least about 1 atom and less than or equal to about 20 atoms. In some embodiments, the particles may have thicknesses within a range of from about 5 atoms to about 20 atoms.

The tubular structures 40 may be utilized to confine conductive particles (for instance, the particles 24 of FIG. 1) along a vertical path through the switching region during formation of a conductive bridge (for instance, the bridge 26 of FIG. 1). The particular architectures of the conductive bridges may depend on, among other things, the interior dimensions of the tubes; the charge, size and composition of the particles; and the composition and charge along the walls of the tubes. For instance, the conductive bridges may comprise particles stacked one directly over the other as shown in the embodiment of FIG. 1, or may comprise particles that spiral along an interior wall of a tube. Regardless, the conductive bridges are confined within the tubes and form a vertical interconnect that extends through the switching region.

Although the tubes are shown to be circular in cross-section, in other embodiments the tubes may have other shapes, and may be, for example, elliptical or polygonal in cross-sectional shape (for instance, the tubes may be hexagonal as discussed below with reference to FIGS. 5-7).

The illustrated cell 10a has a vertical dimension 43 and a lateral dimension 45 orthogonal to the vertical dimension. It can be preferred that the tubes have interior diameters which are substantially smaller than the lateral dimension of the switching region to achieve desired confinement of conductive bridging material. In some embodiments, the tubes may have maximum interior cross-sectional width dimensions which are less than or equal to about 20 percent of the lateral dimension of the switching region.

The tubular structures 40 may be representative of tubular mesostructures (i.e., tubular units) formed by various methods analogous to the methods described in the references listed above. In some embodiments, the tubes may correspond to hexagonal units comprising one or more of GeS, GeSe, SiO, ZrO, TiO, TaO, HfO, AlO, WO, SnO, NbO, ZrTiO, ZrWO, AlTiO, VO, MoO, NiO, YO, ReO, MnO, FeO, SiAlO, SiTiO; where the listed compositions are described in terms of principle components, rather than in terms of specific stoichiometries. For instance, the tubes may correspond to hexagonal units comprising germanium and one or both of sulfur and selenium.

FIGS. 4-7 illustrate an example memory cell 10b analogous to the cell 10a of FIGS. 2 and 3, and comprising hexagonal units 46 (only some of which are labeled) extending through the switching region 16. The hexagonal units may be formed with any suitable processing, including, for example, various methods analogous to the methods described in the references listed above. Thus, in some embodiments the hexagonal units may comprise germanium in combination with one or both of selenium and sulfur.

Figure 4:
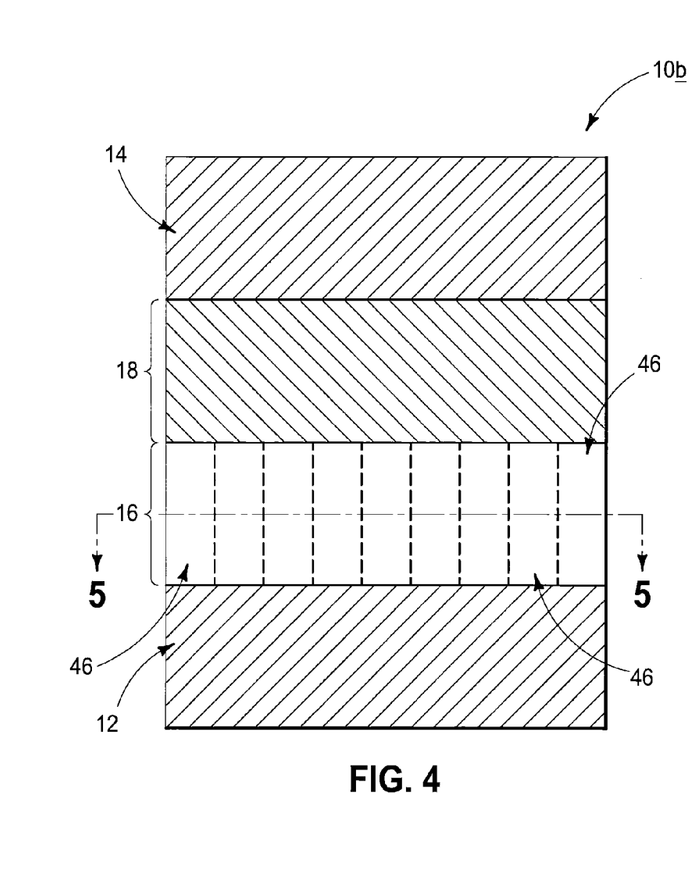
FIG. 4 is a cross-sectional side view of the PMC.

The illustrated hexagonal units have a maximum cross-sectional dimension 47. In some embodiments, such dimension may be less than or equal to about 30 Å; and may be, for example, from about 10 Å to about 20 Å.

Figure 5:
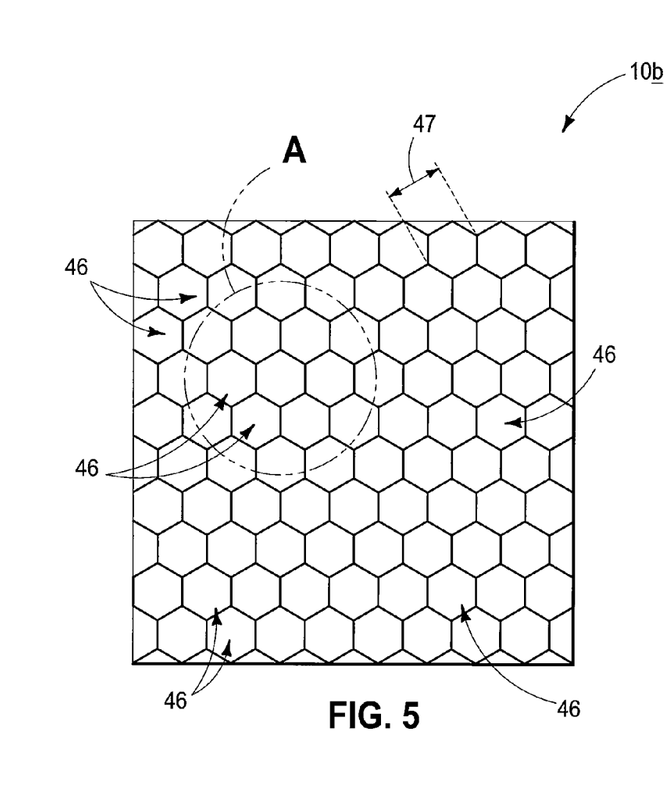
FIG. 5 is a view along the line 5-5 of FIG. 4.
Figure 6:
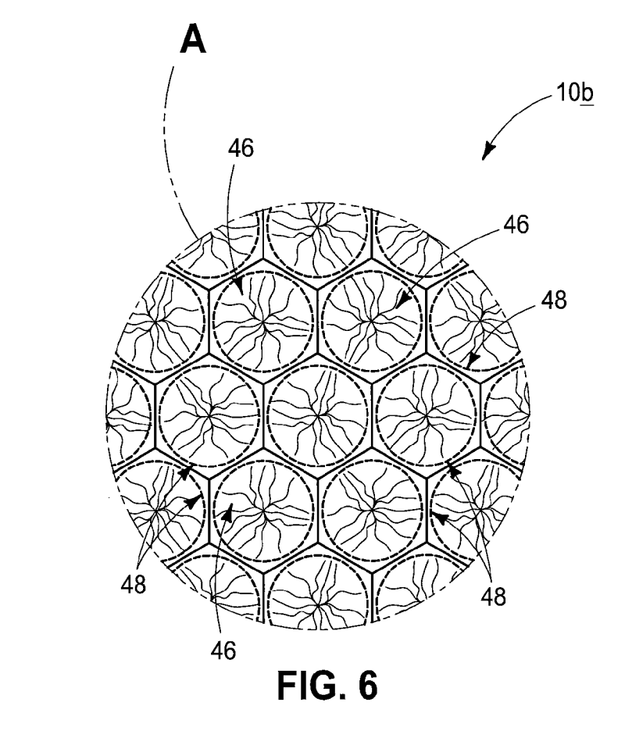
FIG. 6 is a diagrammatic expanded view of a region "A" of FIG. 5, and illustrates an example configuration of a pattern extending across such region.
Figure 7:
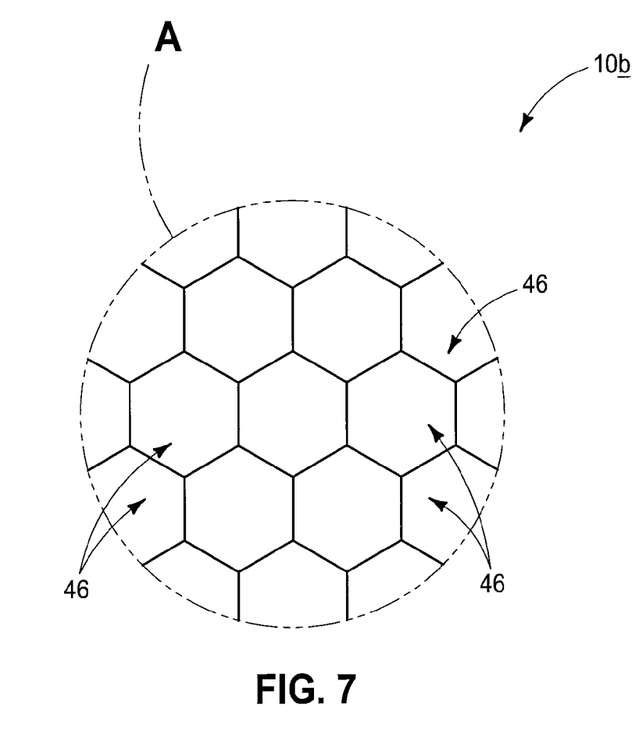
FIG. 7 is another diagrammatic expanded view of the region "A" of FIG. 5, and illustrates another example configuration of a pattern extending across such region.

FIGS. 6 and 7 show an enlarged view of some of the hexagonal units of FIG. 5, and illustrate a couple different embodiments of such hexagonal units. FIG. 6 shows that the hexagonal units 46 (only some of which are labeled) may be formed around core materials 48 (only some of which are labeled). More generally considered, the tubes 46 may be formed around organic material that is within the interior regions of the tubes.

In some embodiments, the hexagonal units may consist of inorganic substances, and the core materials may comprise organic substances. For instance, the hexagonal units may comprise negatively charged clusters of $Ge_4Q_{10}$, (where "Q" corresponds to one or both of sulfur and selenium), and the core material may comprise one or more surfactant counterions. Such configurations may be formed by, for example, processes analogous to those described in Trikalitis et al. and MacLachlan et al.

The conductive particles utilized to form a conductive bridge (for instance, the particles 24 of FIG. 1) may pack into the interiors of the hexagonal units together with the surfactant counterions to form the conductive bridge (analogous to the bridge 26 discussed above with reference to FIG. 1) extending through the switching region 16 (FIG. 4). The composition and charge of the surfactant may be tailored to modify the rate at which the particles pack into the interiors of the hexagonal units, and may thereby be utilized to tailor programming characteristics of a PMC device.

FIG. 7 shows an embodiment in which there is no organic material within the interior regions of the hexagonal units. In some embodiments, the structure of FIG. 7 may correspond to a processing stage subsequent to that of FIG. 6. Specifically, the organic material of FIG. 6 may be removed (for instance, by ashing, calcination, and/or solvent exchange extraction) to leave a construction in which only the inorganic walls of the hexagonal units remain. In some embodiments, it may be advantageous to remove the organic material in order to improve thermal stability of a PMC device. For instance, if the organic material is present, the PMC device may be stable to only about 400° C. (due to thermal degradation of the organic material), whereas the device may be thermally stable to temperatures above 400° C. if the organic material is not present.

The embodiments of FIGS. 2-7 utilize tubular pathways to confine particles during formation of conductive bridges across switching regions. In other embodiments, the pathways may be planar pathways extending across the switching regions, rather than tubular pathways. A planar pathway may confine a conductive bridge along a vertical direction through a switching region, but may allow freedom along a horizontal direction. Thus, the planar pathways provide more confinement of the conductive bridges than is achieved with conventional PMC devices (which essentially have no framework for confining conductive bridges through a switching region), but provide less confinement than is achieved with the tubes of the embodiments of FIGS. 2-7. In some embodiments, it may be advantageous to utilize planar pathways in that it may be more economical to fabricate such pathways than to fabricate tubular pathways, and the control of conductive bridge architecture provided by the planar pathways may be sufficient to achieve desired uniformity of programming characteristics across a memory array.

FIGS. 8-10 illustrate an example memory cell 10c analogous to the cell 10 of FIG. 1, and comprising planar pathways 50 (only some of which are labeled) extending through the switching region 16. In some embodiments, the pathways 50 may correspond to interfaces along alternating lamellar sheets 51 and 53. The lamellar sheets 51 and 53 differ in composition relative to one another, and may be formed in the desired alternating arrangement with any suitable processing. For instance, an upper surface of electrode 12 may be appropriately treated to induce self-assembly of diblock material or other material which forms alternating lamellar sheets. Alternatively, one of the sheets 51 and 53 may consist of inorganic material and the other may comprise organic material (such as, for example, surfactant). After the lamellar sheets are formed in the desired configuration, the organic material may be removed, if so desired.

The device 10c of FIG. 8 may be considered to have a vertical axis through the switching region 16 which is parallel to the planes of the interfaces 50. Such device will have horizontal axes orthogonal to such vertical axis. The cross-section of FIG. 9 has a dashed-line axis 52 provided therein to diagrammatically illustrate that there is freedom along a horizontal axis for the growth of the conductive bridges (analogous to the bridge 26 shown in FIG. 1). FIG. 10 shows a view along one of the interfaces 50, and shows a conductive bridge 26 formed along such interface. The bridge extends vertically along the interface, but has freedom along a horizontal axis 52 so that the bridge is tipped relative to a vertical axis 54 through the switching region. In contrast, if vertical tubes analogous to the tubes of FIGS. 2-7 are utilized instead of the vertical planes, the conductive bridge could be confined along the vertical direction of axis 54.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations show features within the planes of the cross-sections, and generally do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a memory cell comprises a switching region and an ion source region between a pair of electrodes. The switching region is configured to reversibly retain a conductive bridge. The memory cell is in a low resistive state when the conductive bridge is retained within the switching region and is in a high resistive state when the conductive bridge is not within the switching region. An ordered framework extends across the switching region to orient the conductive bridge within the switching region. The framework remains within the switching region in both the high resistive and low resistive states of the memory cell.

In some embodiments, a memory cell comprises a switching region and an ion source region between a pair of electrodes. The switching region is configured to reversibly retain a conductive bridge. The memory cell is in a low resistive state when the conductive bridge is retained within the switching region and is in a high resistive state when the conductive bridge is not within the switching region. A confinement system is within the switching region and is configured to confine material of the conductive bridge along one or more pathways through the switching region. The confinement system remains within the switching region in both the high resistive and low resistive states of the memory cell.

In some embodiments, a memory cell comprises a switching region directly against a first electrode, and comprises an ion source region directly against the switching region. The ion source region comprises one or both of copper and silver. The switching region has a vertical dimension between the first electrode and the ion source region, and has a lateral dimension orthogonal to the vertical dimension. The memory cell also comprises a second electrode directly against the ion source region. The switching region comprises an ordered electrically insulative framework which is configured to orient materials from the ion source region during formation of a conductive bridge of the materials across the switching region. The framework comprises at least one hexagonal tube having a maximum interior cross-sectional width dimension of less than or equal to about 20% of the lateral dimension of the switching region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory cell, comprising:
   a switching region and an ion source region between a pair of electrodes; the switching region being configured to reversibly retain a conductive bridge; the memory cell being in a low resistive state when the conductive bridge is retained within the switching region and being in a high resistive state when the conductive bridge is not within the switching region;
   an ordered framework extending across the switching region to orient the conductive bridge within the switching region; the framework remaining within the switching region in both the high resistive and low resistive states of the memory cell; and
   wherein the ordered framework comprises charged hexagonal units surrounding surfactant counterions.

2. A memory cell, comprising:

a switching region and an ion source region between a pair of electrodes; the switching region being configured to reversibly retain a conductive bridge; the memory cell being in a low resistive state when the conductive bridge is retained within the switching region and being in a high resistive state when the conductive bridge is not within the switching region;

an ordered framework extending across the switching region to orient the conductive bridge within the switching region; the framework remaining within the switching region in both the high resistive and low resistive states of the memory cell; and wherein the ordered framework comprises a hexagonal unit comprising germanium and one or both of sulfur and selenium.

3. A memory cell, comprising:

a switching region and an ion source region between a pair of electrodes; the switching region being configured to reversibly retain a conductive bridge; the memory cell being in a low resistive state when the conductive bridge is retained within the switching region and being in a high resistive state when the conductive bridge is not within the switching region;

an ordered framework extending across the switching region to orient the conductive bridge within the switching region; the framework remaining within the switching region in both the high resistive and low resistive states of the memory cell; and wherein the ordered framework comprises lamellar sheets.

4. A memory cell, comprising:

a switching region directly against a first electrode;

an ion source region directly against the switching region, the ion source region comprising one or both of copper and silver; the switching region having a vertical dimension between the first electrode and the ion source region, and having a lateral dimension orthogonal to the vertical dimension;

a second electrode directly against the ion source region;

wherein the switching region comprises an ordered electrically insulative framework configured to orient materials from the ion source region during formation of a conductive bridge of the materials across the switching region; the framework comprising at least one hexagonal tube having a maximum interior cross-sectional width dimension of less than or equal to about 20% of the lateral dimension of the switching region; and wherein the hexagonal tube comprises germanium and one or both of sulfur and selenium.

5. The memory cell of claim 4 further comprising organic core material within the interior of the tube.

6. The memory cell of claim 4 wherein organic material is not within the interior of the tube.

7. The memory cell of claim 4 further comprising organic core material within the interior of the tube, said organic core material comprising surfactant counterions.

* * * * *